(12) United States Patent
Vovnoboy et al.

(10) Patent No.: US 10,333,465 B2
(45) Date of Patent: Jun. 25, 2019

(54) VCO TUNING RANGE EXTENSION USING PARASITIC DIODE CAPACITANCE CONTROL

(71) Applicant: International Business Machines Corporation, Armonk, NY (US)

(72) Inventors: Jakob Vovnoboy, Haifa (IL); Run Levinger, Haifa (IL)

(73) Assignee: International Business Machines Corporation, Amronk, NY (US)

( * ) Notice: Subject to any disclaimer, the term of this patent is extended or adjusted under 35 U.S.C. 154(b) by 182 days.

(21) Appl. No.: 15/424,852

(22) Filed: Feb. 5, 2017

(65) Prior Publication Data

US 2018/0226921 A1   Aug. 9, 2018

(51) Int. Cl.
| | | |
|---|---|---|
| *H03B 1/00* | (2006.01) | |
| *H03B 5/12* | (2006.01) | |
| *H03L 7/00* | (2006.01) | |
| *H03L 7/197* | (2006.01) | |

(52) U.S. Cl.
CPC ............ *H03B 5/1293* (2013.01); *H03B 1/00* (2013.01); *H03B 5/1215* (2013.01); *H03B 5/1228* (2013.01); *H03B 5/1243* (2013.01); *H03B 5/1265* (2013.01); *H03L 7/00* (2013.01); *H03L 7/1976* (2013.01); *H03B 2200/0062* (2013.01)

(58) Field of Classification Search
CPC .. H03B 5/1228; H03B 5/1243; H03B 5/1293; H03B 5/1215; H03B 5/1265; H03B 1/00; H03L 7/1976; H03L 7/00
USPC ................................ 331/167, 117 FE, 177 V
See application file for complete search history.

(56) References Cited

U.S. PATENT DOCUMENTS

| | | | |
|---|---|---|---|
| 6,023,198 | A | 2/2000 | McKinney et al. |
| 7,116,183 | B2 | 10/2006 | Wu |
| 8,779,863 | B2 | 7/2014 | Nilsson |
| 9,257,939 | B1 | 2/2016 | Zhang et al. |
| 2006/0267693 | A1 | 11/2006 | Buell |

(Continued)

FOREIGN PATENT DOCUMENTS

| | | |
|---|---|---|
| EP | 2506424 | 5/2010 |
| WO | 2012092385 | 7/2012 |

OTHER PUBLICATIONS

Hadipou et al., "A Wide Tuning Range mm-Wave LC VCO", International Journal of Electronics and Electrical Engineering vol. 2, No. 1, Mar. 2014, p. 70-74.

(Continued)

*Primary Examiner* — Arnold M Kinkead
(74) *Attorney, Agent, or Firm* — Gregory J. Kirsch

(57) ABSTRACT

Embodiments of methods and apparatuses may provide the capability to extend the tuning range of a VCO in a way that does not degrade VCO circuit performance. For example, the parasitic capacitance of semiconductor devices in the VCO circuit may be utilized to extend the tuning range of a VCO without significant degradation of VCO circuit performance. For example, in an embodiment, a method voltage-control of an oscillator may comprise receiving a first signal for control of a frequency of an output signal from the oscillator, deriving a second signal from the first signal, controlling the frequency of the output signal from the oscillator using the first signal, and extending a frequency range of the oscillator using the second signal.

16 Claims, 3 Drawing Sheets

(56) References Cited

U.S. PATENT DOCUMENTS

2012/0235759 A1  9/2012  Pfeiffer et al.
2013/0181783 A1* 7/2013  Upadhyaya .......... H03B 5/1228
                                                   331/117 FE

OTHER PUBLICATIONS

Qiong Zou et al., "A Low Phase Noise and Wide Tuning Range Millimeter-Wave VCO Using Switchable Coupled VCO-Cores", IEEE transations om circuits and systems—I: regular papers vol. 62, No. 2, Feb. 2015, p. 554-563.
Li Zhu et al., "IC design of low power, wide tuning range VCO in 90 nm CMOS technology", Journal of Semiconductors vol. 35, No. 12, Dec. 2014 (article No. 125013).

* cited by examiner

VCO TUNING RANGE EXTENSION USING PARASITIC DIODE CAPACITANCE CONTROL

BACKGROUND

The present invention relates to techniques for extending the tuning range of a voltage-controlled oscillator (VCO) using parasitic capacitance of semiconductor devices in the VCO circuit.

Modern phase-locked loops (PLLs) used for communications need to cover wide frequency ranges while maintaining phase noise performance. Enlarging the tuning range using conventional techniques typically causes deterioration of the circuit quality factor, leading to a deterioration in the phase noise performance. Likewise, some conventional techniques, such as banded design and adding switchable varactors, may degrade the maximum operational frequency and still produce some degradation in phase noise.

Accordingly, a need arises for techniques for extending the tuning range of a VCO that does not degrade VCO circuit performance.

SUMMARY

Embodiments of methods and apparatuses may provide the capability to extend the tuning range of a VCO in a way that does not degrade VCO circuit performance. For example, the parasitic capacitance of semiconductor devices in the VCO circuit may be utilized to extend the tuning range of a VCO without significant degradation of VCO circuit performance.

For example, in an embodiment, a method voltage-control of an oscillator may comprise receiving a first signal for control of a frequency of an output signal from the oscillator, deriving a second signal from the first signal, controlling the frequency of the output signal from the oscillator using the first signal, and extending a frequency range of the oscillator using the second signal.

The second signal may be derived from the first signal by performing signal conditioning on the first signal. The signal conditioning may comprise frequency filtering the first signal. The frequency of the output signal may be controlled by controlling a capacitance of at least one voltage-variable capacitance with the first signal and the frequency range of the oscillator may be extended by controlling a parasitic capacitance of at least one amplifying element or a parasitic capacitance of the at least one voltage-variable capacitance with the second signal. At least one of the at least one amplifying element or the at least one voltage-variable capacitance may comprise a MOS device and the parasitic capacitance may be a drain to bulk diode parasitic capacitance of the MOS device. The signal conditioning may comprise analog signal conditioning. The signal conditioning may comprise digital signal conditioning.

For example, in an embodiment, a voltage-controlled oscillator may comprise voltage-controlled oscillator circuitry having a first input for receiving a first signal and configured to control of a frequency of an output signal from the oscillator using the first signal, and having a second input for receiving a second signal and configured to extend a frequency range of the oscillator using the second signal and signal conditioning circuitry configured to derive the second signal from the first signal.

For example, in an embodiment, an apparatus may comprise a voltage-controlled oscillator having a first input for receiving a first signal and configured to control of a frequency of an output signal from the oscillator using the first signal, and having a second input for receiving a second signal and configured to extend a frequency range of the oscillator using the second signal and signal conditioning circuitry configured to derive the second signal from the first signal.

BRIEF DESCRIPTION OF THE DRAWINGS

The details of the present invention, both as to its structure and operation, can best be understood by referring to the accompanying drawings, in which like reference numbers and designations refer to like elements.

DETAILED DESCRIPTION

Embodiments of methods and apparatuses may provide the capability to extend the tuning range of a voltage-controlled oscillator (VCO) in a way that does not degrade VCO circuit performance. For example, the parasitic capacitance of semiconductor devices in the VCO circuit may be utilized to extend the tuning range of a VCO without significant degradation of VCO circuit performance.

Figure 1:
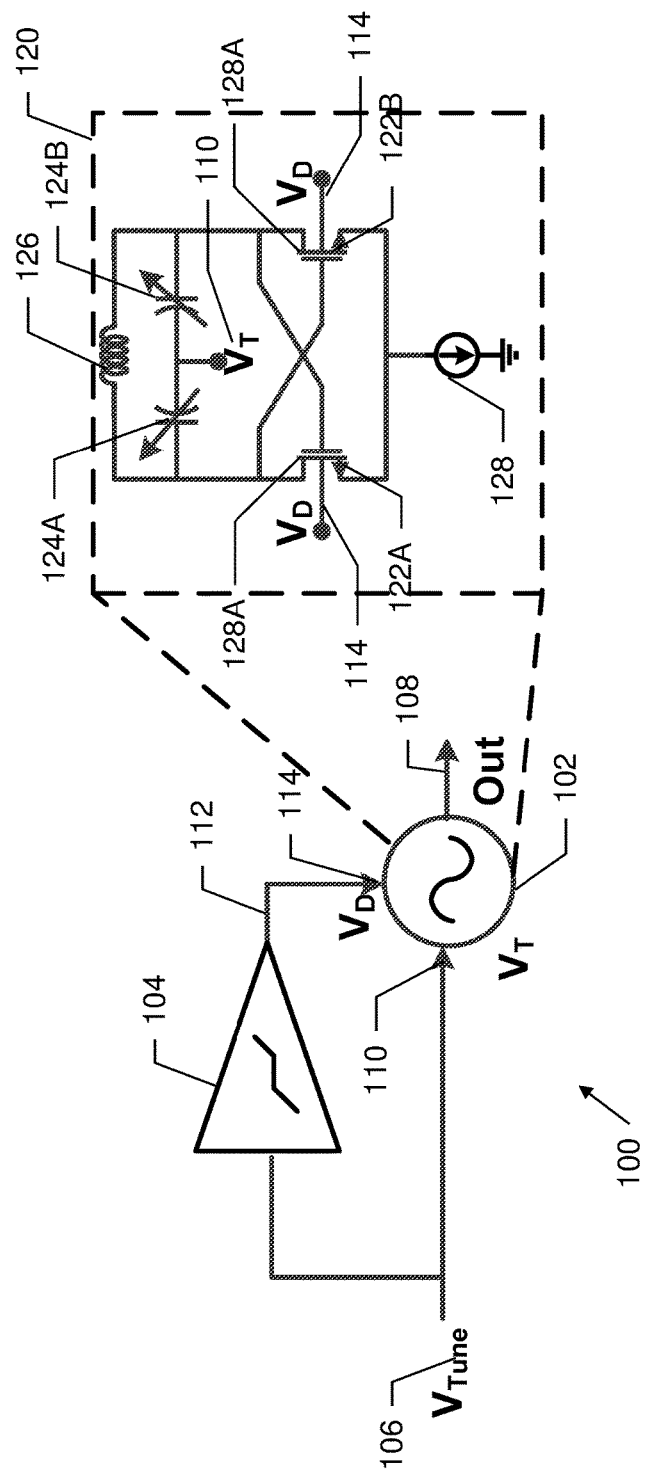
FIG. 1 is an exemplary block diagram and circuit diagram of an embodiment of a VCO in accordance with the present apparatuses and methods.

An exemplary block diagram and circuit diagram 100 of an embodiment of a VCO is shown in FIG. 1. In this example, a block diagram includes a VCO 102 and a signal conditioner 104. VCO 102 is shown in more detail in circuit diagram 120. A tuning voltage, $V_{Tune}$ 106 may be applied to a tuning input 110 of VCO 102 to control the frequency of the output signal 108 from VCO 102. Likewise, $V_{Tune}$ 106 may be applied to signal conditioner 104, which may shape $V_{Tune}$ 106 to form a conditioned drain parasitic capacitance tuning signal $V_D$ 112, which may be applied to drain parasitic capacitance tuning input 114.

Circuit diagram 120 illustrates a simplified exemplary circuit configuration for VCO 102. In this example, VCO 102 includes amplifying elements 122A, B, voltage-variable capacitances 124A, B, inductance 126, and current sink 128. In this exemplary circuit diagram, amplifying elements 122A, B may typically be MOS devices, such as MOS-FET transistors, while voltage-variable capacitances 124A, B, may typically be varactor or varicap diodes, which may be implemented, for example, using MOS devices. Inductance 126 may typically be an on-chip or external inductor. Current sink 128 may absorb current from amplifying elements 122A, B. In this example, VCO 102 output frequency may be controlled by one or more voltage-variable capacitances 124A, B connected to the LC tank. $V_{Tune}$ 106 may be applied to tuning input 110, and $V_D$ 112 may be applied to drain parasitic capacitance tuning inputs 114. Typically, $V_{Tune}$ 106 may be used to control the frequency of the output signal 108 from VCO 102.

The frequency of the output signal 108 from VCO 102 may also be controlled by changing the parasitic capacitance of the drain/bulk diodes of amplifying elements 122A, B, which are connected to the tank circuitry (here LC). Drain parasitic capacitance tuning inputs 114 are connected to the bulk terminals or connections of amplifying elements 122A, B. When applied to drain parasitic capacitance tuning inputs 114, $V_D$ 112 biases the drain/bulk diodes of amplifying elements 122A, B, which alters the parasitic capacitances 128A, B of the drain/bulk diodes 122A, B. The parasitic capacitances 128A, B may change according to $$C_{diode} = \frac{c_{jo}}{\sqrt{1+\frac{V_{BD}}{V_{bi}}}}.$$

Utilizing the parasitic capacitances of the drain/bulk diodes of amplifying elements 122A, B in VCO 102 may provide the capability to extend the tuning range of VCO 102 with little or no performance degradation.

In the example shown in FIG. 1, $V_D$ 112 is applied to the bulk terminals or connections of amplifying elements 122A, B. In some embodiments, voltage-variable capacitances 124A, B may be varactor or varicap diodes that have bulk terminals or connections as well. For example, varactor or varicap diodes may be implemented as MOS devices having gate, source, drain, and bulk terminals or connections. In such embodiments, $V_D$ 112 may be applied to the bulk terminals or connections of the varactor or varicap diodes instead of, or in addition to, being applied to the bulk terminals or connections of amplifying elements 122A, B.

Figure 2:
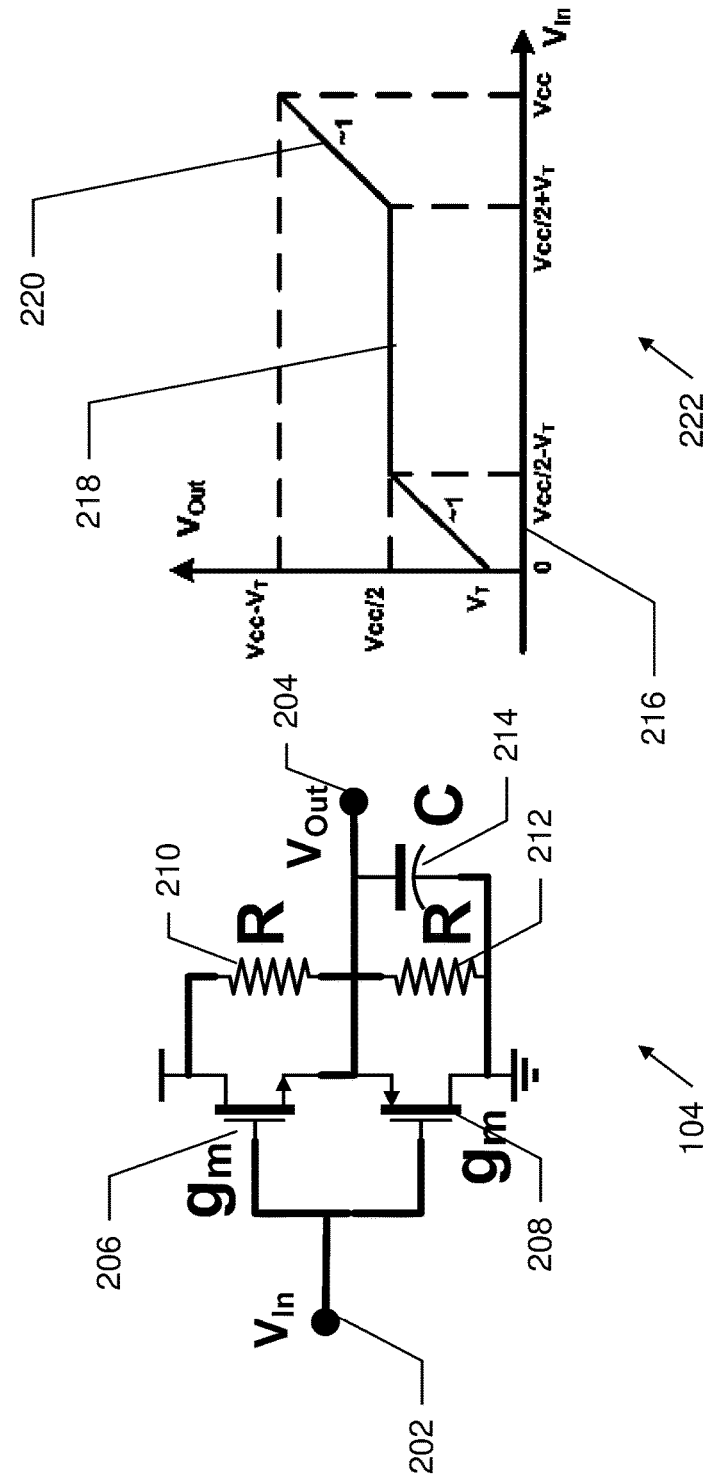
FIG. 2 is a simplified exemplary circuit diagram of a signal conditioner as shown in FIG. 1.

A simplified exemplary circuit diagram of a signal conditioner 104 is shown in FIG. 2. In this example, signal conditioner 104 may include an input $V_{In}$ 202 and an output $V_{Out}$ 204. As shown in FIG. 1, the signal $V_{Tune}$ 106 may be applied to input $V_{In}$ 202 and output $V_{Out}$ 204 may output the signal $V_D$ 112, which may be applied to drain parasitic capacitance tuning input 114. In this example, signal conditioner 104 may produce a signal $V_D$ 112 having the characteristics shown. With such signal conditioning, $V_D$ 112 may be used to extend the VCO tuning range and linearize the gain in a broader $V_{Tune}$ 106 region.

In this exemplary embodiment, signal conditional 104 operates as a non-linear amplifier. Use of such a signal conditioner may provide extension of the tuning range of the VCO and may prevent gain degradation at the band edges. In this example, signal conditioner 104 may include a n-channel transistor 206, an p-channel transistor 208, a first resistor 210, a second resistor 212, and a capacitor 214.

The transistors should have sufficient transconductance so that: $(g_m)^{-1} \ll R/2$ for $|V_{GS}| > V_T$, where $g_m$ is the nmos/pmos transconductance, $V_{GS}$ is gate source voltage, and $V_T$ is the transistor threshold voltage. Then for $V_{in} < V_{CC}/2 - V_T$ 216: p-channel transistor operates as a source follower and the n-channel transistor is off. For $V_{CC}/2 + V_T > V_{in} > V_{CC}/2 - V_T$ 218, both transistors are off. For $V_{in} > V_{CC}/2 + V_T$ 220, the n-channel transistor operates as a source follower and the p-channel transistor is off. This may produce a transfer function 222 as shown in FIG. 2. Capacitor 214 may be selected or designed such that: 1/RC will be low as possible while $g_m/C$ is still higher than the input frequency bandwidth. This may provide filtering of the resistor noise at the circuit output when both transistors are off. Accordingly, for $|V_{in} - V_{CC}/2| > V_T$: the output noise PSD is $$V_N^2(f) = \frac{KT\gamma}{g_m}.$$

Likewise, for $|V_{in} - V_{CC}/2| < V_T$: the output noise PSD is $$V_N^2(f) = \frac{2KT}{\pi RC^2 f^2}.$$

In the example shown in FIG. 2, an analog signal conditioner is shown. In embodiments, other analog signal conditioner configurations may be used. Likewise, in embodiments, digital signal conditioner configurations may be used. Any and all configurations of analog or digital signal conditioners may be applicable to the present methods and apparatuses.

Figure 3:
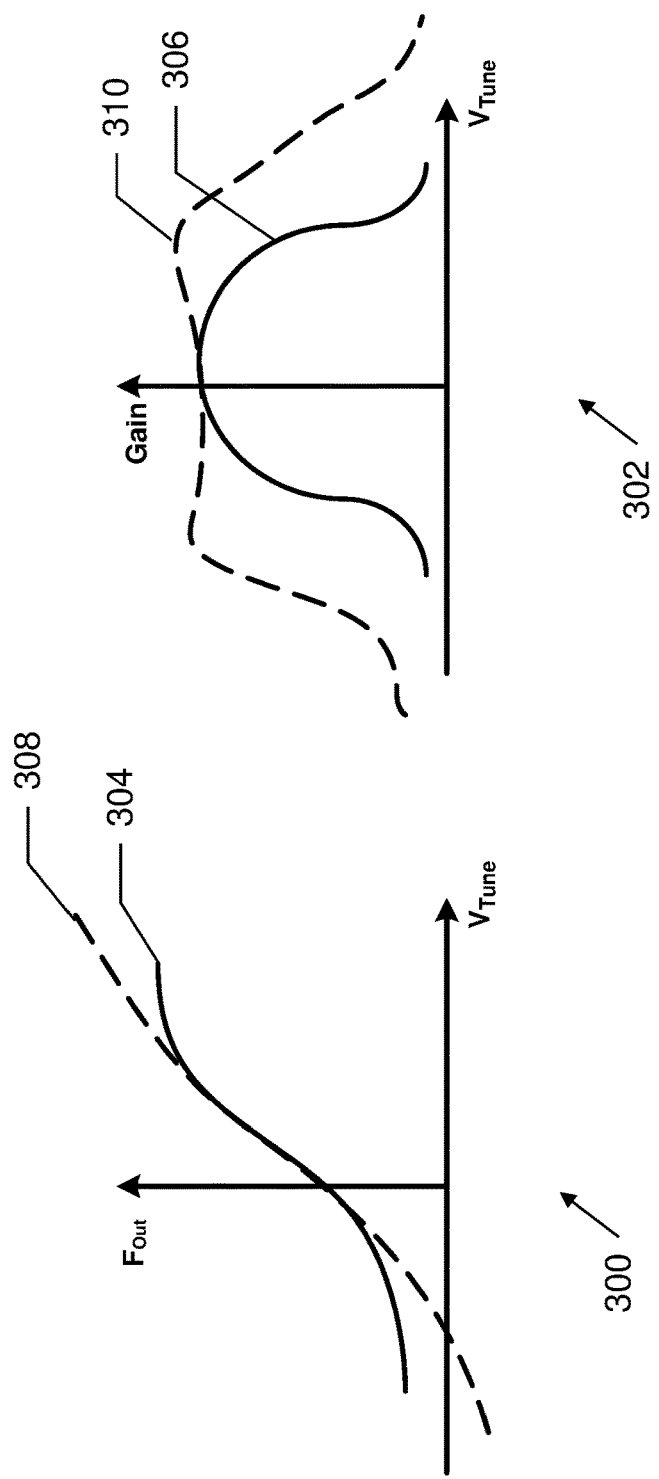
FIG. 3 is an exemplary diagram of extension of the VCO tuning range and linearization of the gain for the circuit examples shown in FIGS. 1 and 2.

An example of extension of the VCO tuning range 300 and linearization of the gain 302 for the circuit examples shown in FIGS. 1 and 2 is shown in FIG. 3. An exemplary tuning range 304 and gain 306 for a conventional VCO are shown, as an exemplary tuning range 308 and gain 310 for the circuit examples shown in FIGS. 1 and 2. As may be seen, the tuning range 308 has been extended relative to the conventional VCO tuning range 304. Likewise, the gain 310 has been linearized relative to the conventional VCO gain 306.

The present invention may be a system and/or a method at any possible technical detail level of integration. Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method of voltage-control of an oscillator comprising:
   receiving a first signal for control of a frequency of an output signal from the oscillator;
   deriving a second signal from the first signal, wherein the second signal is derived from the first signal by performing signal conditioning on the first signal, and wherein the signal conditioning comprises a non-linear transformation of the first signal;
   controlling the frequency of the output signal from the oscillator using the first signal; and
   extending a frequency range of the oscillator using the second signal.

2. The method of claim 1, wherein the frequency of the output signal is controlled by controlling a capacitance of at least one voltage-variable capacitance with the first signal; and
   the frequency range of the oscillator is extended by controlling a parasitic capacitance of at least one amplifying element or a parasitic capacitance of the at least one voltage-variable capacitance with the second signal.

3. The method of claim 2, wherein at least one of the at least one amplifying element or the at least one voltage-variable capacitance comprises a MOS device and the parasitic capacitance is a drain to bulk diode parasitic capacitance of the MOS device.

4. The method of claim 2, wherein the signal conditioning comprises analog signal conditioning.

5. The method of claim 2, wherein the signal conditioning comprises digital signal conditioning.

6. A voltage-controlled oscillator comprising:
   voltage-controlled oscillator circuitry having a first input for receiving a first signal and configured to control of a frequency of an output signal from the oscillator using the first signal, and having a second input for receiving a second signal and configured to extend a frequency range of the oscillator using the second signal; and signal conditioning circuitry configured to derive the second signal from the first signal;

wherein the signal conditioning circuitry comprises circuitry to perform a non-linear transformation on the first signal.

7. The voltage-controlled oscillator of claim 6, further comprising:

at least one voltage-variable capacitance controlled by the first signal.

8. The voltage-controlled oscillator of claim 7, wherein the second input is connected to a parasitic capacitance of at least one amplifying element or a parasitic capacitance of the at least one voltage-variable capacitance with the second signal.

9. The voltage-controlled oscillator of claim 8, wherein at least one of the at least one amplifying element or the at least one voltage-variable capacitance comprises a MOS device and the parasitic capacitance is a drain to bulk diode parasitic capacitance of the MOS device.

10. The voltage-controlled oscillator of claim 9, wherein the signal conditioning circuitry comprises analog signal conditioning circuitry.

11. The voltage-controlled oscillator of claim 9, wherein the signal conditioning circuitry comprises digital signal conditioning circuitry.

12. An apparatus comprising:

a voltage-controlled oscillator having a first input for receiving a first signal and configured to control of a frequency of an output signal from the oscillator using the first signal, and having a second input for receiving a second signal and configured to extend a frequency range of the oscillator using the second signal; and signal conditioning circuitry for deriving the second signal from the first signal;

wherein the signal conditioning circuitry comprises circuitry to perform a non-linear transformation on the first signal.

13. The apparatus of claim 12, wherein the voltage-controlled oscillator comprises:

at least one voltage-variable capacitance controlled by the first signal.

14. The apparatus of claim 13, wherein the second input is connected to a parasitic capacitance of at least one amplifying element or a parasitic capacitance of the at least one voltage-variable capacitance with the second signal.

15. The apparatus of claim 14, wherein at least one of the at least one amplifying element or the at least one voltage-variable capacitance comprises a MOS device and the parasitic capacitance is a drain to bulk diode parasitic capacitance of the MOS device.

16. The apparatus of claim 12, wherein the signal conditioning circuitry comprises analog signal conditioning circuitry or digital signal conditioning circuitry.

* * * * *